(12) United States Patent
Tian et al.

(10) Patent No.: US 6,545,258 B2
(45) Date of Patent: Apr. 8, 2003

(54) PHOTO-SENSOR CROSS-SECTION FOR INCREASED QUANTUM EFFICIENCY

(75) Inventors: Hui Tian, Stanford, CA (US); William R. Bidermann, Los Gatos, CA (US); David X. D. Yang, Mountain View, CA (US); Yi-Hen Wei, San Jose, CA (US)

(73) Assignee: Pixim, Inc., Mountain View, CA (US)

( * ) Notice: Subject to any disclaimer, the term of this patent is extended or adjusted under 35 U.S.C. 154(b) by 23 days.

(21) Appl. No.: 09/822,036

(22) Filed: Mar. 30, 2001

(65) Prior Publication Data

US 2002/0139922 A1 Oct. 3, 2002

(51) Int. Cl.$^7$ .................. H01L 27/00; H01L 31/00; H01L 31/062; H01L 29/267; H01L 21/00
(52) U.S. Cl. .................. 250/214.1; 250/208.1; 257/81; 257/291; 438/94; 438/96
(58) Field of Search .................. 250/214.1, 208.1, 250/239, 216; 257/80, 81, 82, 83, 84, 422, 433, 291, 290; 438/57, 69, 73, 75, 91, 94, 93, 96, 144

(56) References Cited

U.S. PATENT DOCUMENTS

| | | | |
|---|---|---|---|
| 5,162,887 A | | 11/1992 | Dierschke |
| 5,324,930 A | * | 6/1994 | Jech, Jr. .................. 250/208.1 |
| 5,488,239 A | | 1/1996 | Jung |
| 5,731,622 A | | 3/1998 | Sugiyama et al. |
| 5,841,176 A | | 11/1998 | Merrill |
| 5,942,775 A | | 8/1999 | Yiannoulos |
| 5,965,875 A | * | 10/1999 | Merrill .................. 250/208.1 |
| 5,970,316 A | | 10/1999 | Merrill |
| 6,054,746 A | | 4/2000 | Bird et al. |
| 6,072,206 A | | 6/2000 | Yamashita et al. |

OTHER PUBLICATIONS

"p–i–n PHTOTODIODE", Complete Guide To Semiconductor Devices, Chapter 50, pp. 402–407. No Date Available.

* cited by examiner

Primary Examiner—Georgia Epps
Assistant Examiner—Alicia Harrington
(74) Attorney, Agent, or Firm—Steve Mendelsohn; Yuri Gmuzdkov; Joe Zheng (57) ABSTRACT

Photo-sensors, such as photo-diodes, are formed using regions with cross-sections that increase the overall quantum efficiency of the resulting photo-sensor. The cross-sections have additional (e.g., interior) side-wall interfaces, and, in some embodiments, an additional, relatively shallow bottom interface. The increased total side-wall area and any additional shallow bottom area increase the total photo-junction volume located near the surface of the device. As a result, a greater fraction of photons having relatively small absorption lengths (e.g., blue light) will be absorbed within a photo-junction, thereby increasing the quantum efficiency for those photons. The present invention enables photo-sensors to be implemented with more uniform spectral response.

12 Claims, 6 Drawing Sheets

PHOTO-SENSOR CROSS-SECTION FOR INCREASED QUANTUM EFFICIENCY

BACKGROUND OF THE INVENTION

1. Field of the Invention

The present invention relates to photo-sensitive semiconductor devices, such as photo-diodes for integrated image sensors.

2. Description of the Related Art

The quantum efficiency of an image sensor is defined as the ratio of the number of collected photoelectrons (or photo-holes) to the number of incident photons. (Although the following discussion refers primarily to photo-electrons, those skilled in the art will understand that analogous teachings apply to photoholes.) An ideal image sensor without internal amplification has a quantum efficiency of 1.0, where each incident photon results in a single collected photo-electron. In real-world applications, however, certain effects prevent real image sensors from attaining ideal quantum efficiency.

Figure 1A:
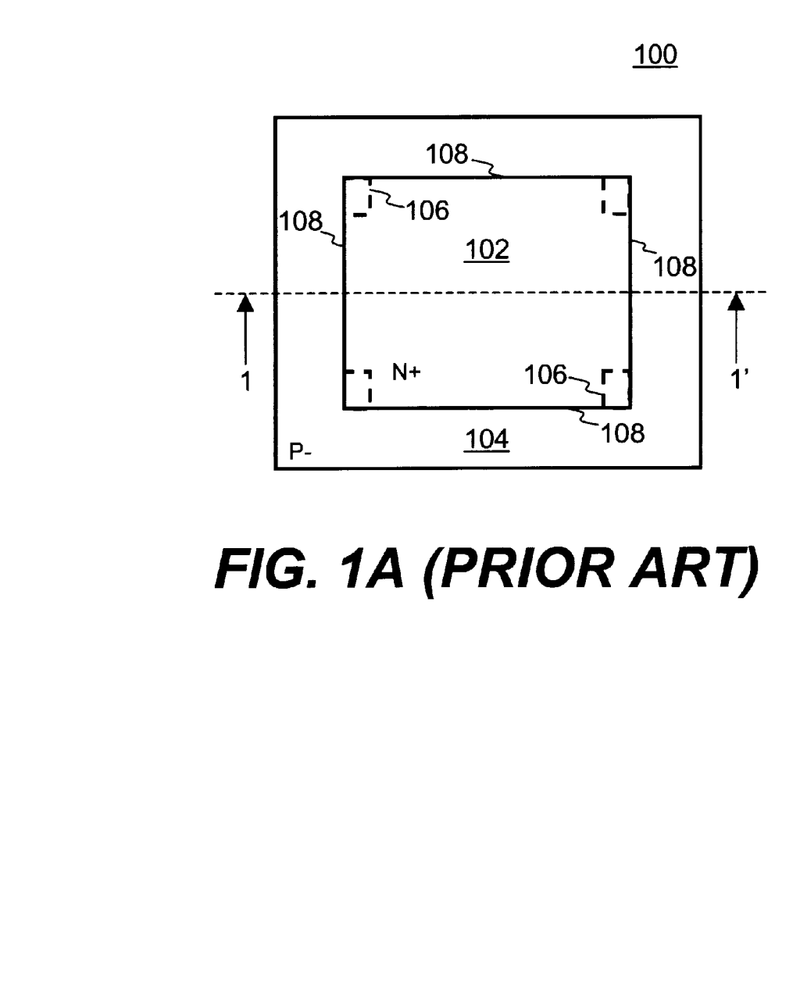
FIG. 1A shows a schematic top view of a typical photo-diode that is part of a conventional integrated image sensor.
Figure 1B:
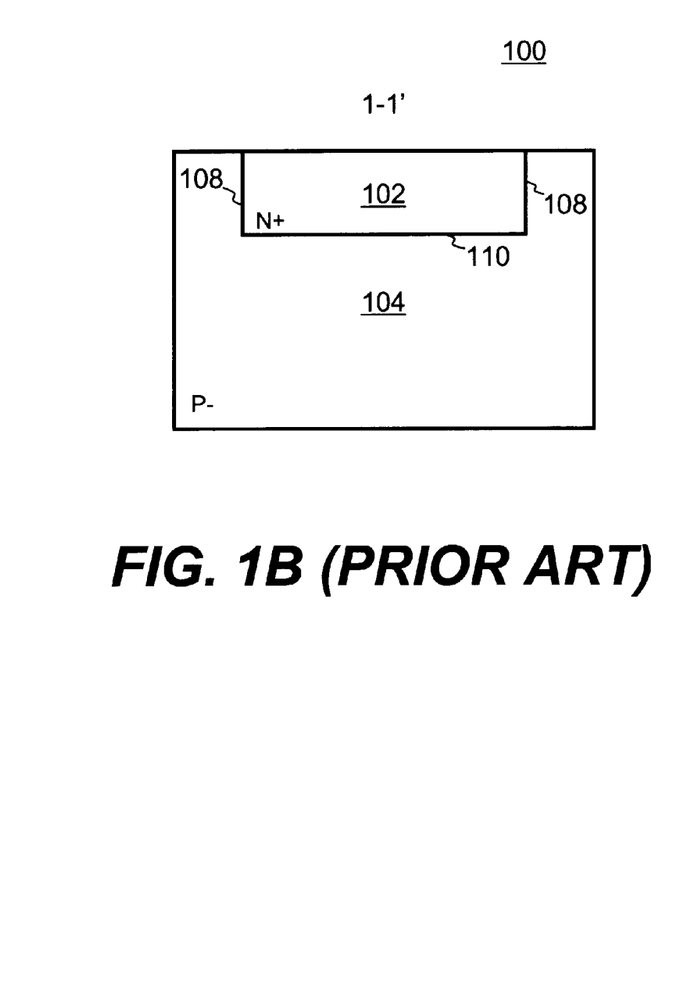
FIG. 1B shows a schematic cross-sectional view of the photo-diode of FIG. 1A as defined by line 1—1' in FIG. 1A.

FIG. 1A shows a schematic top view of a typical photo-diode 100 that is part of a conventional integrated image sensor. FIG. 1B shows a schematic cross-sectional view of photo-diode 100. Photo-diode 100 comprises an N+ region 102 formed within a P− substrate 104, only a portion of which is represented in FIGS. 1A–B. As shown in FIG. 1A, region 102 has a rectangular layout in which each interior angle 106 is a right angle (i.e., 90 degrees). In addition, region 102 has four side-walls 108 and a bottom 110.

In operation, an electrical bias is applied between region 102 and substrate 104 to provide photosensitive depletion regions, also referred to as photo-junctions (not shown), at the interfaces between region 102 and substrate 104 (i.e., along side-walls 108 and bottom 110). When a photon of appropriate wavelength is absorbed within a photo-junction, an electron-hole pair is generated and then separated by the applied electrical bias into a "free" photo-electron and a "free" photo-hole. Ideally, each photo-electron is collected by the sensor electronics (not shown) to form part of the photo-electric signal generated by the illuminated photo-diode.

Depending on the particular application, one of the problems associated with image sensors is related to the fact that photons having different wavelengths have different absorption lengths (i.e., the distances that photons typically penetrate through the photo-diode structures before being absorbed). For example, in a typical image sensor designed for visible light, photons having longer wavelengths (e.g., corresponding to red light) have a larger absorption length than photons having shorter wavelengths (e.g., corresponding to blue light). As such, a higher fraction of incident blue photons are absorbed within the photo-diode structure before reaching a photo-junction than the fraction of incident red photons. Photons that are absorbed before reaching a photo-junction produce less efficiently collected photo-electrons. As such, in a typical image sensor, the quantum efficiency of the sensor varies as a function of the frequency of the incident light, with a higher quantum efficiency for red light than for blue light. This results in an image sensor having non-uniform spectral sensitivity, which is a disadvantage in many imaging applications.

Another effect that limits the quantum efficiency of an image sensor is leakage. Leakage occurs when the collected photo-charge crosses the junction before the signal can be read. In addition to reducing quantum efficiency, such leakage can also result in unacceptably high levels of offset and dark noise, especially as technology shrinks and image sensors become more sensitive.

SUMMARY OF THE INVENTION

Embodiments of the present invention are configured to address problems including (a) non-uniform sensor spectral sensitivity and (b) leakage, each of which limits the overall quantum efficiency of the resulting photo-sensors. In particular, for example, some photo-diodes in accordance with the present invention have geometries with (1) relatively large total interface areas and (2) non-rectangular layouts in which all interior angles are larger than 90 degrees. The large total interface area can improve the uniformity of sensor sensitivity by providing more photo-junction volume close to the surface of the photo-diode, thereby enabling a greater fraction of incident photons having smaller absorption lengths to be absorbed within photo-junctions and produce collected photo-electrons. A non-rectangular layout with all interior angles greater than 90 degrees can decrease leakage by decreasing the electric field strengths as well as the physical stresses along the non-horizontal (e.g., vertical) edges of the photo-diode. Whether implemented together or independently, these features tend to improve the overall quantum efficiency of the corresponding image sensors.

In one embodiment, the present invention is an integrated circuit having a photo-sensing element comprising a first region formed within a substrate, wherein a vertical cross-section of the first region defines a set of interior side-wall interfaces, a set of exterior side-wall interfaces, and a set of one or more bottom interfaces, such that a horizontal line can be drawn through the vertical cross-section that would cross a first exterior surface, followed by a first interior surface, followed by a second interior surface, followed by a second exterior surface.

In another embodiment, the present invention is a method for fabricating an integrated circuit having a photo-sensing element comprising the steps of (a) forming a first region within a substrate, wherein a vertical cross-section of the first region defines a set of interior side-wall interfaces, a set of exterior side-wall interfaces, and a set of one or more bottom interfaces, such that a horizontal line can be drawn through the vertical cross-section that would cross a first exterior surface, followed by a first interior surface, followed by a second interior surface, followed by a second exterior surface; and (b) forming one or more additional structures on the substrate in conjunction with the first region to fabricate the photo-sensing element.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Reference herein to "an embodiment" means that a particular feature, structure, or characteristic described in connection with the embodiment can be included in at least one embodiment of the invention. The appearances of the term "embodiment" in various places in the specification are not necessarily all referring to the same embodiment, nor are separate or alternative embodiments mutually exclusive of other embodiments. The description herein is largely based on a particular image sensor based on digital pixel sensor architecture. Those skilled in the art can appreciate that the description can be equally applied to other image and light sensors.

Specific Embodiments

Figure 2A:
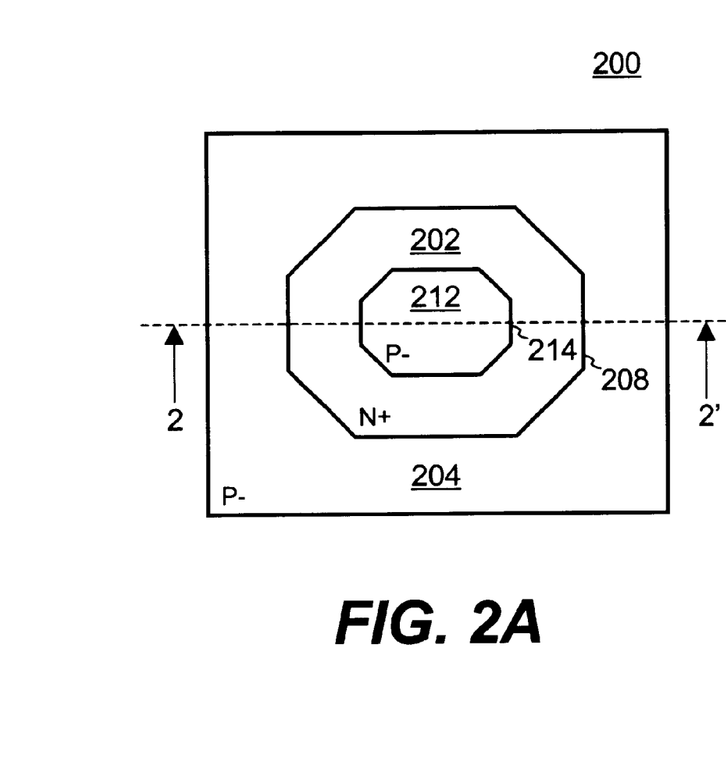
FIG. 2A shows a schematic top view of a photo-diode, according to one embodiment of the present invention.
Figure 2B:
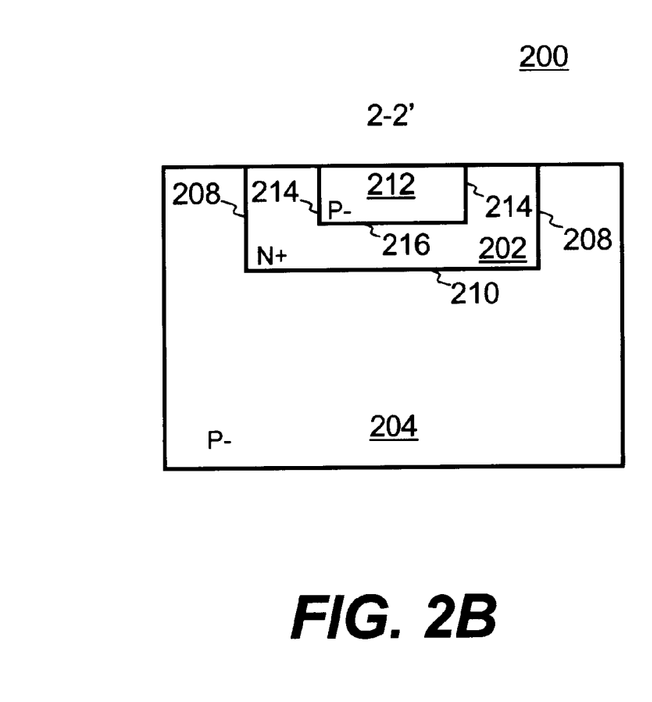
FIG. 2B shows a schematic cross-sectional view of the photo-diode of FIG. 2A as defined by line 2—2' in FIG. 2A.

FIG. 2A shows a schematic top view of a photo-diode 200, according to one embodiment of the present invention. FIG. 2B shows a schematic cross-sectional view of photo-diode 200. Photo-diode 200 comprises an N+ first region 202 formed within P− substrate 204. In addition, a P second region 212 is formed within first region 202, where P second region 212 preferably has, but is not necessarily required to have the same chemical composition as P substrate 204. In general, P second region 212 may be a P− or a P+ region. P− regions are harder to form, but are better for quantum efficiency.

As shown in FIG. 2A, both first region 202 and second region 212 have layouts corresponding to octagons, where each interior angle between adjacent sides is greater than 90 degrees. In preferred embodiments, each interior angle in the layout of each region is about 135 degrees.

A regular octagon has eight sides of equal length and eight interior angles of equal size (i.e., 135 degrees). While the layouts of regions 202 and/or 212 may correspond to regular octagons, they are not so limited. Those skilled in the art will understand that, in general, any rectangle can be converted into an octagon having all interior angles of 135 degrees by replacing each 90-degree corner with an intervening side that forms two 135-degree angles with the two adjacent sides of the original rectangle. Note that, in preferred implementations, region 212 is electrically connected to substrate 204 (connection not shown in figures) so that, during operation, region 212 and substrate 204 can be maintained at the same electric potential.

For devices having the same overall dimensions, photo-diode 200 has a greater total side-wall area than photo-diode 100 of FIGS. 1A–B, since photo-diode 200 has interior side-walls 214 between regions 212 and 202 in addition to exterior side-walls 208 between region 202 and substrate 204. In addition, photo-diode 200 has a greater total bottom area than photo-diode 100, since photo-diode 200 has bottom 216 of region 212 in addition to bottom 210 of region 202.

In operation, an electrical bias is applied between region 202, on the one hand, and substrate 204 and region 212, on the other, to provide photo-junctions at the interfaces both between substrate 204 and region 202 and between region 202 and region 212. Because it has a larger total interface area, photo-diode 200 has a larger total photo-junction volume than photo-diode 100. It also has more photo-junction volume near the surface of the integrated circuit, due to both the addition of interior walls 214 as well as the relative shallowness of bottom 216 of region 212. As a result, more photons corresponding to light having a relatively short absorption length will be absorbed within a photo-junction of photo-diode 200 than in photo-diode 100, resulting in a higher quantum efficiency for photo-diode 200 for those wavelengths as compared to that of photo-diode 100. The overall result of this feature is an image sensor having a more uniform spectral sensitivity.

Moreover, since regions 202 and 212 both have octagonal shapes with all interior angles greater than 90 degrees, the electric field strengths and mechanical stresses along the vertical edges of photo-diode 200 will typically be less than those along the vertical edges of photo-diode 100, resulting in relatively lower levels of leakage for photo-diode 200 as compared to photo-diode 100. This, too, increases the quantum efficiency of photo-diode 200 relative to photo-diode 100.

Figure 3A:
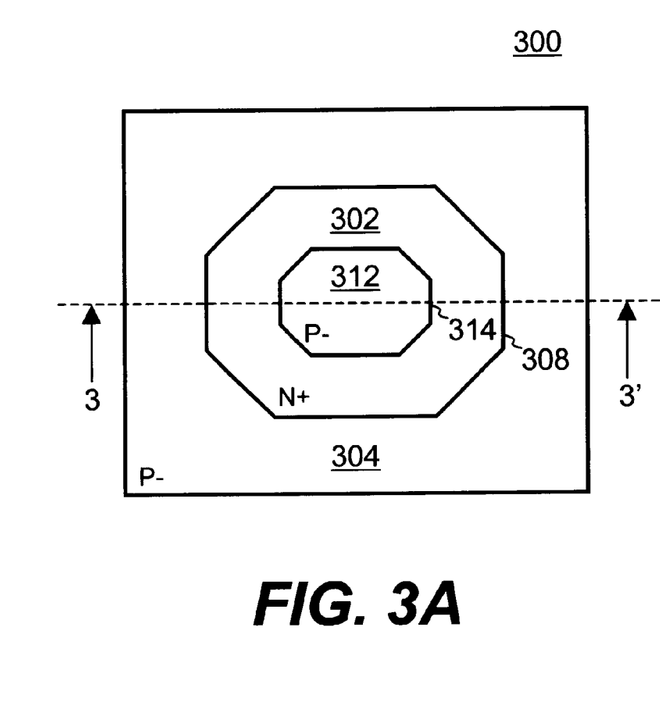
FIG. 3A shows a schematic top view of a photo-diode, according to another embodiment of the present invention.
Figure 3B:
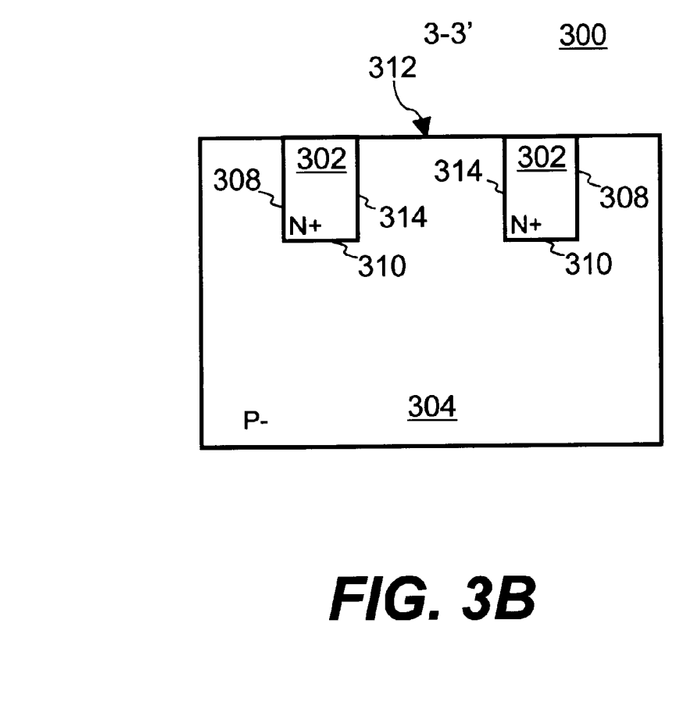
FIG. 3B shows a schematic cross-sectional view of the photo-diode of FIG. 3A as defined by line 3—3' in FIG. 3A.

FIG. 3A shows a schematic top view of a photo-diode 300, according to another embodiment of the present invention. FIG. 3B shows a schematic cross-sectional view of photo-diode 300. Photo-diode 300 has a similar configuration as photo-diode 200 of FIGS. 2A–B, except that, instead of being formed from a region within a region, photo-diode 300 comprises a single annular N+ region 302 formed within P− substrate 304. As a result, the layout of photo-diode 300 is similar to that of photo-diode 200, but the cross-section is different, as shown in FIG. 3B. In particular, photo-diode 300 has exterior side-walls 308, interior side-walls 314, and bottom 310. Moreover, region 312 is not a distinct region, but is rather the part of substrate 304 that falls within annular region 302.

Figure 4A:
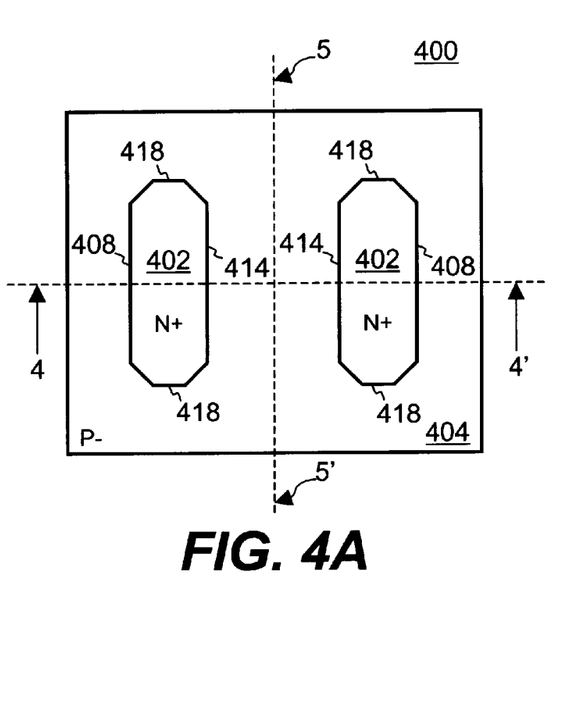
FIG. 4A shows a schematic top view of a photo-diode, according to another embodiment of the present invention.
Figure 4B:
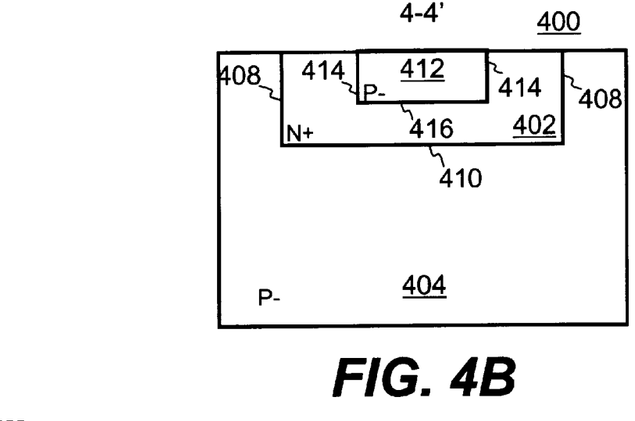
FIG. 4B shows a schematic cross-sectional view of the photo-diode of FIG. 4A as defined by line 4—4' in FIG. 4A.
Figure 4C:
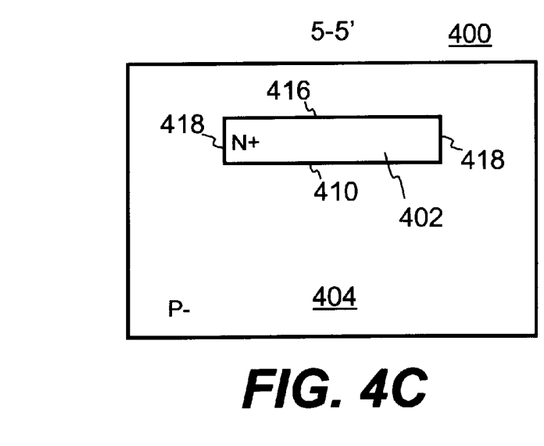
FIG. 4C shows a schematic cross-sectional view of the photo-diode of FIG. 4A as defined by line 5—5' in FIG. 4A.

FIG. 4A shows a schematic top view of a photo-diode 400, according to another embodiment of the present invention. FIGS. 4B and 4C show schematic cross-sectional views of photo-diode 400. Photo-diode 400 has a similar configuration as photo-diode 200 of FIGS. 2A–B, except that P− second region 412 in photodiode 400 extends all the way across opposing sides of N+first region 402 within P− substrate 404. As a result, the cross-section of photo-diode 400 shown in FIG. 4B is similar to that of photo-diode 200, but the layout is different, as shown in FIG. 4A, and the cross-section shown in FIG. 4C is also different. In particular, photo-diode 400 has exterior side-walls 408, interior side-walls 414, end-walls 418, and bottoms 410 and 416.

Figures 5A, 5B, 5C:
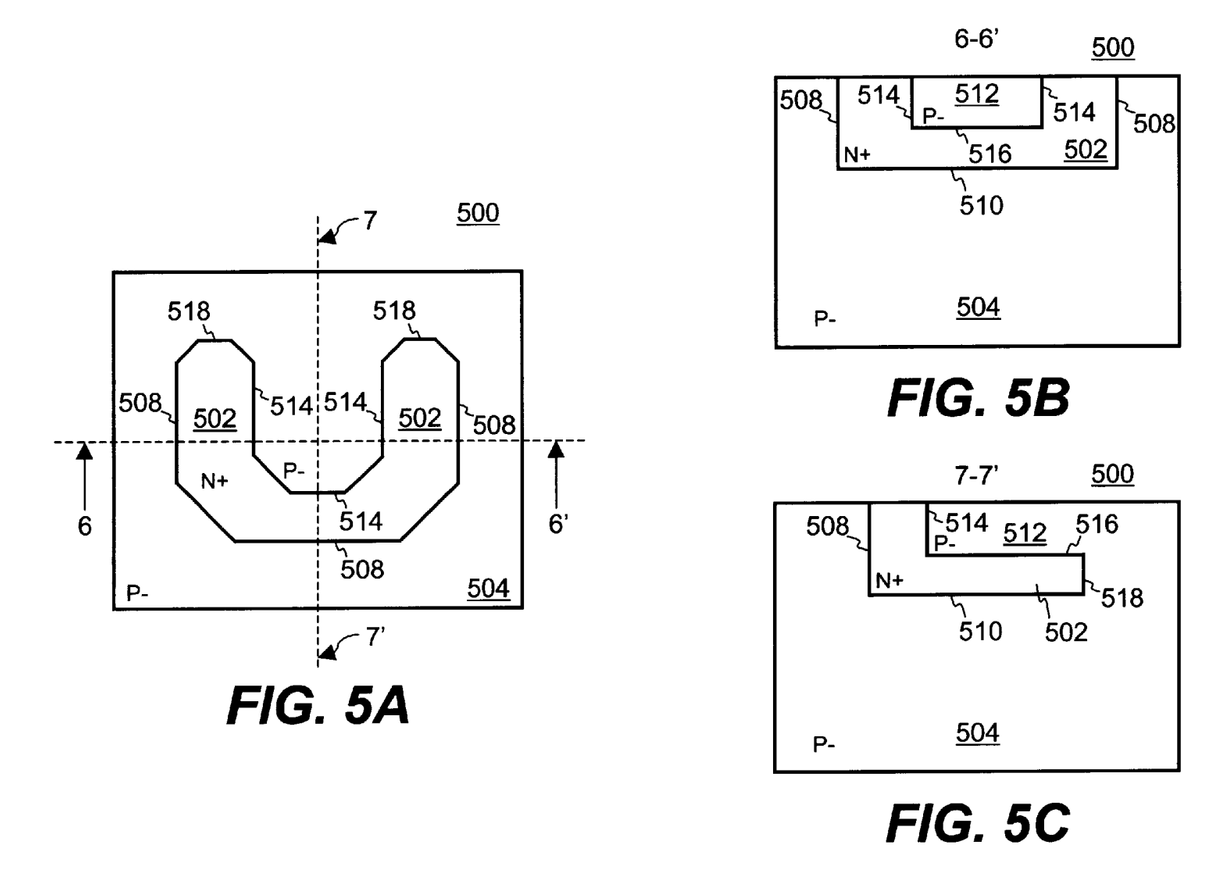
FIG. 5A shows a schematic top view of a photo-diode, according to another embodiment of the present invention.
FIG. 5B shows a schematic cross-sectional view of the photo-diode of FIG. 5A as defined by line 6—6' in FIG. 5A.
FIG. 5C shows a schematic cross-sectional view of the photo-diode of FIG. 5A as defined by line 7—7' in FIG. 5A.

FIG. 5A shows a schematic top view of a photo-diode 500, according to another embodiment of the present invention. FIGS. 5B and 5C show schematic cross-sectional views of photo-diode 500. Photo-diode 500 has a similar configuration as photo-diode 400 of FIGS. 4A–C, except that P− second region 512 in photo-diode 500 extends to only one side of N+ first region 502 within P– substrate 504. As a result, the cross-section of photo-diode 500 shown in FIG. 5B is similar to that of photo-diode 400, but the layout is different, as shown in FIG. 5A, and the cross-section shown in FIG. 5C is also different. In particular, photo-diode 500 has exterior side-walls 508, interior side-walls 514, end-walls 518, and bottoms 510 and 516.

Advantages

Significantly, as compared to photo-diode 100 of FIGS. 1A–B, photo-diodes 300, 400, and 500 of FIGS. 3–5 have some of the same basic advantages as photo-diode 200. In particular, for devices having the same overall dimensions, some of the photo-diodes have a greater total side-wall area than photo-diode 100, for example, with the addition of the interior side-walls. In addition, some of the photo-diodes have a greater total bottom area than photo-diode 100, with the addition of the bottom of the second region formed within the first region. Moreover, the layouts of the regions can reduce both electric field strengths and mechanical stresses along the vertical edges of the photo-diodes relative to photo-diode 100, due to the absence of 90-degree angles. As result of these features, the photo-diodes of the present invention can have a more uniform sensitivity and lower leakage than photo-diode 100, thereby providing image sensors having more uniform spectral response and increased quantum efficiencies.

Some of the embodiments shown in FIGS. 2–5 have specific advantages over other embodiments of the present invention. For example, since the interior region is contiguous with the substrate, no additional structure is needed to ensure that the interior region is held at the same electrical potential as the substrate during operation. Although, on the one hand, the embodiment of Fig. C has the smallest total bottom area, on the other hand, that embodiment may involve the simplest fabrication, since only a single annular region needs to be formed within the substrate, as opposed to the other embodiments, which require a second region to be formed within the first region. Similarly, each embodiment has a different relative amount of total side-wall area vs. total bottom area. As such, different embodiments may be more suitable for different applications, depending on the particular requirements for sensor uniformity and overall quantum efficiency.

Generalizations Regarding Cross-Sections

Although the cross-sectional views described previously show regions formed within substrates, where the regions have rectangular cross-sections with vertical side-walls, those skilled in the art will understand that such regions may have other geometries, including inverted trapezoidal shapes having sloped side-walls and a flat bottom or curved shapes having smooth transitions between the side-walls and the region's bottom.

Although the present invention has been described in the context of photo-diodes surrounded laterally by the substrate material, it will be understood that other configurations are possible, including those in which the photo-diodes are surrounded laterally by shallow trench isolation (STI) structures.

Generalizations Regarding Layouts

In the previous discussions, the present invention has been described in the context of embodiments that are based on modifications to conventional photo-diodes, such as photo-diode 100 of FIGS. 1A–B, having rectangular layouts. In general, a conventional photo-diode having a rectangular layout can be converted into a photo-diode according to embodiments of the present invention by replacing each 90-degree corner with an intervening side that forms two angles with the two mutually orthogonal adjacent sides of the original rectangle, where those two angles are greater than 90 degrees (e.g., 135 degrees each). The present invention, however, is not so limited.

Figure 6:
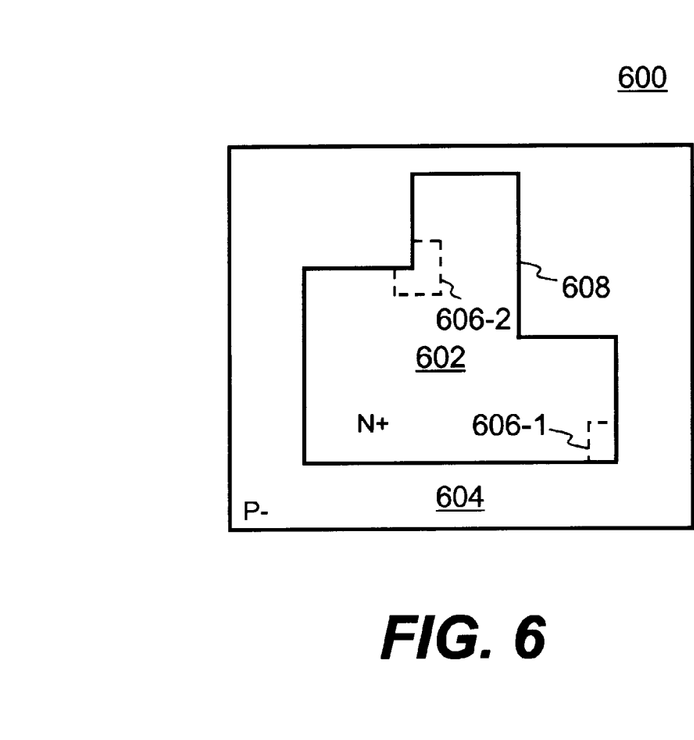
FIG. 6 shows a schematic top view of a possible photo-diode, according to the conventional art.

FIG. 6 shows a schematic top view of a possible photo-diode 600, according to the conventional art, comprising an N+ region 602 formed within P– substrate 604. As shown in FIG. 6, in the layout of photo-diode 600, region 602 has eight sides 608 and each interior angle in region 602 is either 90 degrees or 270 degrees, reflecting the fact that each pair of adjacent sides are mutually orthogonal (i.e., they meet at a right angle). For example, interior angle 606-1 is a 90-degree angle, while interior angle 606-2 is a 270-degree angle.

Figure 7:
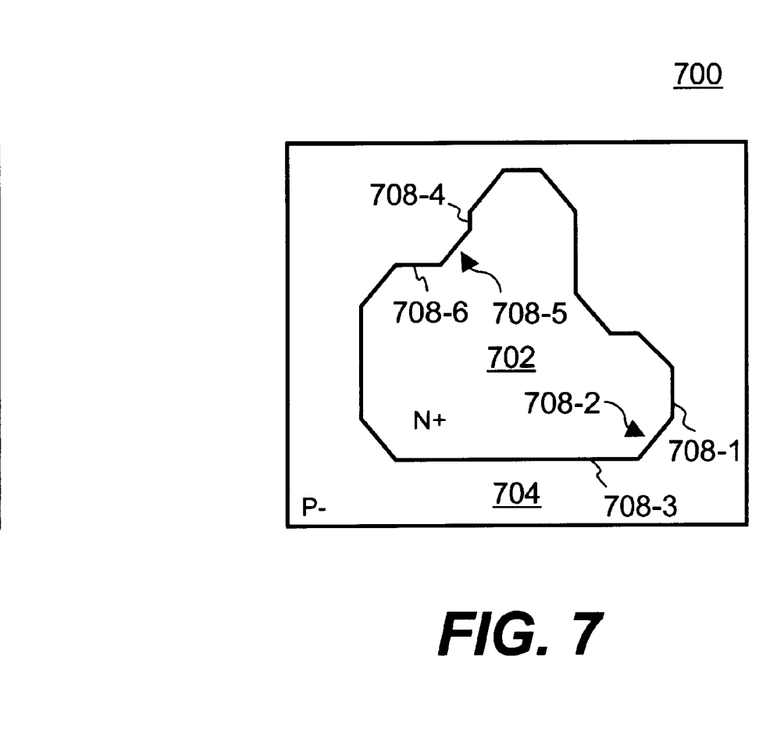
FIG. 7 shows a schematic top view of a photo-diode corresponding to the photo-diode of FIG. 6, but whose layout has been modified according to the present invention.

FIG. 7 shows a schematic top view of a photo-diode 700 corresponding to photo-diode 600 of FIG. 6, comprising a N+ region 702 formed within P– substrate 704, but whose layout has been modified in accordance with embodiments of the present invention. In particular, in the layout of photo-diode 700, each 90-degree angle in region 602 of photo-diode 600 has been replaced by an intervening side that forms two interior angles of about 135 degrees with the two corresponding mutually orthogonal adjacent sides of region 602 and each 270-degree angle in region 602 has been replaced by an intervening side that forms two interior angles of about 225 degrees with the two corresponding mutually orthogonal adjacent sides of region 602. For example, in FIG. 7, intervening side 708-2 forms two 135-degree angles with mutually orthogonal sides 708-1 and 708-3, and intervening side 708-5 forms two 225-degree angles with mutually orthogonal sides 708-4 and 708-6.

As such, region 702 in photo-diode 700 has a 16-sided layout in which each interior angle is greater than 90 degrees, and specifically either about 135 degrees or about 225 degrees. As such, the electric field strengths and mechanical stresses along the vertical edges of photo-diode 700 will be less than those in photodiode 600, resulting in lower leakage levels and therefore higher overall quantum efficiencies.

The layout feature of the present invention can be generalized in a number of different ways. According to one generalization, embodiments of the present invention have layouts having five or more sides in which each interior angle is greater than 90 degrees. According to this generalization, an embodiment of the present invention could be a photo-diode having a layout with a pentagonal shape in which each interior angle is 108 degrees.

Another way to generalize the layout feature of the present invention is that certain embodiments of the present invention have layouts in which at least one pair of mutually orthogonal sides has an intervening side that forms two interiors angles greater than 90 degrees with the mutually orthogonal sides. For example, in photo-diode 700 of FIG. 7, mutually orthogonal sides 708-1 and 708-3 have an intervening side 708-2 that forms two interior angles greater than 90 degrees with sides 708-1 and 708-3. This condition would be satisfied even if every other corner in photo-diode 700 were a right angle. This generalization of the present invention is explicitly intended to prevent designing around the scope of this patent with layouts that retain a small number of right angles (e.g., one), while utilizing the layout feature of the present invention to reduce leakage along other edges of the photo-diode.

Although the present invention has been described in the context of photo-diodes having layouts defined by sides that are straight, the present invention is not so limited. In other embodiments, a photo-diode may have a layout defined by a combination of one or more straight sides and one or more curved sides. In still other embodiments, the layout of the photo-diode may be defined by a single contiguous curve, including those in which the layout is defined by an ellipse, including a circle. Those skilled in the art will understand that a circular layout, which has the lowest possible circumference-to-area ratio, would produce relatively low electrical fields and mechanical stresses resulting in lower leakage levels.

Other Generalizations

Although the present invention has been described in the context of photo-diodes comprising N+ regions formed within P− substrates, those skilled in the art will understand that alternative configurations are possible, including, for example, P+ regions formed within N− substrates. Those skilled in the art will also understand that a wide variety of types and/or concentrations of impurities can be used to dope the various photo-diode structures to achieve the desired photo-electric characteristics for a particular photo-diode.

In general, the substrates used in the imaging devices of the present invention may be made of any suitable semiconductor material, such as Si or InGaAs, with wells of different dopant types to form various structures. Each photo-sensing element may be based on any suitable light-sensitive device, such as, for example, a photo-diode, a photo-transistor, a photo-gate, photo-conductor, a charge-coupled device, a charge-transfer device, or a charge-injection device, formed at an appropriate location on or within the substrate.

As used in this specification, the term "light" refers to any suitable electromagnetic radiation in any wavelength and is not necessarily limited to visible light.

Although the present invention has been described in the context of photo-sensing elements for image sensors, it will be understood that the present invention can be implemented for regions of the electromagnetic spectrum outside of the visible light range. Similarly, although the present invention has been described in the context of image sensors implemented using digital pixel sensor (DPS) elements, it will be understood that the present invention can also be applied to other applications, including image sensors implemented with photo-sensing elements other than DPS elements, such as analog pixel sensor (APS) elements and charge-coupled device (CCD) elements.

In general, the present invention may be implemented for image sensors having one or more photo-sensing elements arranged in either a one- or two-dimensional pattern, such as an array of elements arranged in rows and columns. The photo-sensing elements within a given sensor array as well as the corresponding light-reflecting elements may have the same or different areas and/or shapes.

Unless explicitly stated otherwise, each numerical value and range should be interpreted as being approximate as if the word "about" or "approximately" preceded the value of the value or range.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

It will be further understood that various changes in the details, materials, and arrangements of the parts which have been described and illustrated in order to explain the nature of this invention may be made by those skilled in the art without departing from the principle and scope of the invention as expressed in the following claims. Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. An integrated circuit having a photo-sensing element, the photo-sensing element comprising:
   (a) a first region formed within a substrate defining a horizontal substrate plane; and
   (b) a second region located within the first region, wherein:
      a cross-section of the photo-sensing element vertical to the substrate plane defines:
         (1) a set of interior side-wall interfaces between the first region and the second region;
         (2) a set of exterior side-wall interfaces between the first region and the substrate; and
         (3) a set of one or more horizontal interfaces between the first region and the substrate, such that a horizontal line can be drawn through the vertical cross-section that would cross a first exterior side-wall interface, followed by a first interior side-wall interface, followed by a second interior side-wall interface, followed by a second exterior side-wall interface; and
      the second region is contiguous with the substrate.

2. The invention of claim 1, wherein the photo-sensing element is a photo-diode, a photo-transistor, a photo-gate, photo-conductor, a charge-coupled device, a charge-transfer device, or a charge-injection device.

3. The invention of claim 1, wherein the first region has a layout shape defined by an inner polygon circumscribed within an outer polygon, wherein the interior of the inner polygon defines the second region.

4. The invention of claim 1, wherein the second region forms a channel running to at least one side of the first region, wherein the second region is contiguous with the substrate at the at least one side of the first region.

5. The invention of claim 4, wherein the channel formed by the second region runs across the first region such that the second region is contiguous with the substrate at opposing sides of the first region.

6. The invention of claim 4, wherein the channel formed by the second region runs across the first region such that the second region is contiguous with the substrate at only one side of the first region.

7. A method for fabricating an integrated circuit having a photo-sensing element comprising:
   forming a first region formed within a substrate defining a horizontal substrate plane; and
   forming a second region located within the first region, wherein:
      a cross-section of the photo-sensing element vertical to the substrate plane defines:
         a set of interior side-wall interfaces between the first region and the second region;
         a set of exterior side-wall interfaces between the first region and the substrate; and
         a set of one or more horizontal interfaces between the first region and the substrate, such that a horizontal line can be drawn through the vertical cross-section that would cross a first exterior sidewall interface, followed by a first interior sidewall interface, followed by a second interior sidewall interface, followed by a second exterior sidewall interface; and the second region is contiguous with the substrate.

8. The invention of claim 7, wherein the photo-sensing element is a photo-diode, a photo-transistor, a photo-gate, photo-conductor, a charge-coupled device, a charge-transfer device, or a charge-injection device.

9. The invention of claim 7, wherein the first region has a layout shape defined by an inner polygon circumscribed within an outer polygon, wherein the interior of the inner polygon defines the second region.

10. The invention of claim 7, wherein the second region forms a channel running to at least one side of the first region, wherein the second region is contiguous with the substrate at the at least one side of the first region.

11. The invention of claim 10, wherein the channel formed by the second region runs across the first region such that the second region is contiguous with the substrate at opposing sides of the first region.

12. The invention of claim 10, wherein the channel formed by the second region runs across the first region such that the second region is contiguous with the substrate at only one side of the first region.

* * * * *